(12) United States Patent
Wang et al.

(10) Patent No.: US 10,649,327 B2
(45) Date of Patent: May 12, 2020

(54) MOLD WITH CAVITIES FOR NANOIMPRINT LITHOGRAPHY AND METHOD OF IMPRINTING SAME

(71) Applicant: SHANDONG UNIVERSITY OF SCIENCE AND TECHNOLOGY, Qingdao, Shandong (CN)

(72) Inventors: Qing Wang, Shandong (CN); Jintao Zhang, Shandong (CN); Rui Zhang, Shandong (CN); Xu Zheng, Shandong (CN); Lijun Ma, Shandong (CN); Xingyuan Zhang, Shandong (CN); Wenquan Du, Shandong (CN)

(73) Assignee: SHANDONG UNIVERSITY OF SCIENCE AND TECHNOLOGY, Qingdao (CN)

( * ) Notice: Subject to any disclaimer, the term of this patent is extended or adjusted under 35 U.S.C. 154(b) by 0 days.

(21) Appl. No.: 16/370,927

(22) Filed: Mar. 30, 2019

(65) Prior Publication Data

US 2019/0227430 A1 Jul. 25, 2019

Related U.S. Application Data

(63) Continuation of application No. PCT/CN2017/105608, filed on Oct. 11, 2017.

(30) Foreign Application Priority Data

Oct. 17, 2016 (CN) .............................. 201610902369

(51) Int. Cl.
G03F 7/00 (2006.01)
B29C 59/02 (2006.01)
B82Y 40/00 (2011.01)

(52) U.S. Cl.
CPC .......... *G03F 7/0002* (2013.01); *B29C 59/026* (2013.01); *B82Y 40/00* (2013.01)

(58) Field of Classification Search
None
See application file for complete search history.

(56) References Cited

U.S. PATENT DOCUMENTS 3,055,055 A * 9/1962 Cook ...................... B29C 45/30
425/447
4,574,444 A * 3/1986 Humpolik .............. B21D 39/04
165/178

(Continued)

FOREIGN PATENT DOCUMENTS

CN 101403855 A 4/2009
CN 102393600 A 3/2012

(Continued)

*Primary Examiner* — Matthew J Daniels
*Assistant Examiner* — Mohammad M Ameen
(74) *Attorney, Agent, or Firm* — Wayne & Ken, LLC; Tony Hom

(57) ABSTRACT

A mold with cavities for nanoimprint lithography and a method of imprinting the same. The mold is a one-piece structure, including an upper mold and a lower mold which are welded together. The upper mold is evenly provided with a plurality of stepped holes. A plurality of grooves are provided at an upper surface of the lower mold. Both ends of each groove are respectively connected to an external high-pressure water pump and an external vacuum pump via pipelines. An airtight cavity is additionally provided at the interior of the mold to form a negative pressure in the cavity by vacuumizing during the imprint process. In the demolding, a crack is formed at the interface between the mold and the imprint resist by using water pressure and expands to the entire interface for the demolding of the imprinted structure.

4 Claims, 3 Drawing Sheets

(56) References Cited

U.S. PATENT DOCUMENTS

| | | |
|---|---|---|
| 8,747,092 B2 | 6/2014 | Zhang |
| 2004/0017020 A1 | 1/2004 | Loving |
| 2005/0202350 A1 | 9/2005 | Colburn |
| 2010/0244324 A1* | 9/2010 | Zhang .................... B29C 33/46 |
| | | 264/335 |
| 2015/0300978 A1* | 10/2015 | Tseng .................... G01Q 60/30 |
| | | 204/403.06 |

FOREIGN PATENT DOCUMENTS

| | | |
|---|---|---|
| CN | 102508410 A | 6/2012 |
| CN | 103624992 A | 3/2014 |
| CN | 106371286 A | 2/2017 |
| JP | 6007091 B2 | 8/2012 |
| KR | 20080033676 A | 4/2008 |
| WO | 03084863 A1 | 10/2003 |

* cited by examiner

MOLD WITH CAVITIES FOR NANOIMPRINT LITHOGRAPHY AND METHOD OF IMPRINTING SAME

CROSS-REFERENCE TO RELATED APPLICATIONS

This application is a continuation of International Patent Application No. PCT/CN2017/105608, filed on Oct. 11, 2017, which claims the benefit of priority from Chinese Application No. 201610902369.0, filed on Oct. 17, 2016. The contents of the aforementioned applications, including any intervening amendments thereto, are incorporated herein by reference.

TECHNICAL FIELD

The present invention relates to the fabrication of micro- and nano-devices, and in particular to a mold for nanoimprint lithography and a method of imprinting the same, more specifically, a mold with cavities for nanoimprint lithography and a method of imprinting the same.

BACKGROUND OF THE INVENTION

Nanoimprint lithography involves imprint process and demolding process, both of which are important for the quality of the imprinted structures.

For the imprinted structures with low aspect ratio, the quality mainly depends on the demolding process, and is usually stable in the imprint process causing a small impact on the final products.

However, as the aspect ratio of the imprinted structures increases, the imprint process will has an increasing influence on the quality of the imprinted structures. As a result, the imprint process may be as important as or even more important than the demolding process. That is, the imprinted structures with high aspect ratio rely on both of the imprint process and the demolding process.

Conventional demolding methods mainly include a drawing method and a peel-off demolding method. However, these two approaches cannot be used for the imprinting and demolding of the imprinted structures with high aspect ratio, as will be described below.

For the drawing method, the upper and lower interfaces of the imprint resist during the demolding are subjected to stresses in the opposite directions. Adhesion, which is considered as an internal force, exists between the mold and the imprint resist. A vertical interface of the imprinted structure is subjected to a shear stress. When the vertical interface is cracked, the mold and the imprinted structure slide relative to each other. At this time, friction occurs at the vertical interface.

During the demolding, the vertical interface is under a great shear stress and a transverse interface is under a great tensile stress due to the adhesion and friction between the mold and the imprint resist (polymer). Interfaces may be separated only if the tensile stress or the shear stress at the interface is greater than the corresponding shear strength or tensile strength. Under the action of the adhesion at the upper transverse interface and the shear stress and adhesion at the vertical interface, the closer the protrusion is to the residual layer, the greater the vertical tensile stress is. The vertical stress reaches a maximum at the interface between the residual layer and the protrusion of the imprinted structure. The protrusion of the imprinted structure may be necked due to the elastic deformation of the imprint resist itself. When the internal tensile stress of the protrusion of the imprinted structure is greater than that of the imprint resist, the imprinted structure may be broken when pulled out. At the same time, the tensile stress may be transferred from the imprint resist through the residual layer to the adhesive interface between the substrate and the residual layer. When the tensile stress at the adhesive interface is greater than the tensile strength therein, the imprint resist is detached from the substrate, namely, adhesive failure.

The above defects often lead to undesirable imprinting and contamination of the mold.

Particularly, when the aspect ratio of the imprinted structure is greater than 3, the problem that protrusions of the imprinted structure may be pulled off will be one of the main defects during the imprint process. As the aspect ratio of the imprinted structure increases, the protrusion of the imprinted structure will be easily broken, which becomes a big issue and limits the further development of the imprinted structure with high aspect ratio.

Chinese Patent Application Publication CN101249938A discloses a pneumatic demolding structure for micro- and nano-imprint. Based on the conventional structure of the mold, gas is injected to the interface edge between the mold and the imprint resist, and pressure is uniformly applied to the mold using isotone of the gas to prevent deviation of the direction of demolding, allowing for smooth demolding. At the same time, gas molecules penetrate through the interface between the mold and the imprint resist, which reduces the adhesion at the interface.

The above demolding method effectively reduces the difficulty of demolding and the damage to the imprinted structures during the demolding to some extent. However, the demolding structure or demolding method can hardly be applied to the demolding of a large-area imprinted structure with high aspect ratio, because there is a large interface between the imprint resist and the mold, and the molecules penetrate slowly, resulting a low demolding efficiency. Therefore, the imprinted structure with high aspect ratio still has a high risk of being broken using the demolding method.

Particularly, since the grooves in the mold is unventilated, residual air exists in the grooves during the imprint, especially the imprint of large-area imprinted structure with high aspect ratio. Therefore, on the one hand, a larger pressure is required to be exerted to the imprint resist, and under the large pressure the residual air enters into the imprint resist to form bubbles or pores, resulting in internal defects of the imprinted structure and reduced quality. On the other hand, the demolding method of the imprinted structure mainly involves an "upward pull" during the demolding (an "upward push" exerted by air is auxiliary). Therefore, under the upward pull, the middle portion of the protrusions of the imprinted structure will be necked, leading to the broken imprinted structures.

SUMMARY OF THE INVENTION

An object of the present invention is to provide a mold with a cavity for nanoimprint lithography, which has good imprint quality, simple demolding operation, and small damage to the imprinted structure during the demolding. The mold is suitable for the molding of conventional imprinted structures and imprinted structures with high aspect ratio.

In order to achieve the above object, the present invention provides a mold with a cavity for nanoimprint lithography. The mold is a one-piece structure, including an upper mold and a lower mold which are welded together.

The upper mold is evenly provided with a plurality of stepped holes. A diameter of an upper portion of each stepped hole is greater than a diameter of a lower portion of each stepped hole. The stepped holes penetrate through the upper mold.

A length-to-diameter ratio of the upper portion of the stepped hole is 3-30:1. The diameter of the upper portion of the stepped hole is 5-10 times the diameter of the lower portion of the stepped hole.

The number of the stepped holes and a relative position between the stepped holes respectively correspond to the number of protrusions of an imprinted structure and a relative position between the protrusions of the imprinted structure. The upper portion of the stepped hole and the corresponding protrusion of the imprinted structure are equal in size.

A plurality of grooves are provided at an upper surface of the lower mold. The grooves penetrate through the lower mold.

A diameter of each groove is larger than the diameter of the lower portion of the stepped hole.

The lower portion of the stepped hole communicates with the corresponding groove.

Two connecting tubes are respectively provided at both ends of the groove by welding. One connecting tube is connected to an external high pressure water pump via a first pipeline, and the other connecting tube is connected to an external vacuum pump via a second pipeline.

The first pipeline and the second pipeline each are provided with a pressure gage and a pressure regulating valve.

The invention provides technical effects as follows. Cavities are provided at an interior of the mold. The cavities communicate with protrusions of the imprinted structure or resist (i.e., the upper portions of the stepped holes) through the lower portions of the stepped holes (nanopores), and communicate with the external high-pressure water pump and the external vacuum pump. The external vacuum pump is configured for vacuum pumping to create a negative pressure in the cavity, thus overcoming the problems that the imprint resist cannot smoothly and effectively enter the interior of the mold with high aspect ratio and bubbles or pores may remain in the imprint resist during the imprint process.

Under pressure of the high-pressure water from the external high-pressure water pump, the demolding of the invention is realized by exerting force from the interior of the imprinted structure (i.e., the "upward push"), as compared to the demolding method in prior art. Therefore, the present invention basically solves the problem that under a concentrated vertical stress in the conventional drawing demolding, the protrusions of the imprinted structure are broken due to necking in the middle portion of the imprinted structure.

The invention enables the direction, uniformity and synchronism of the stresses at different parts of the imprinted structure to be completely the same during the demolding. Therefore, the invention achieves good demolding quality and stable imprinted structures.

It should be noted that the diameter of the groove is larger than the diameter of the lower portion of the stepped hole merely for the purpose of welding the upper and lower molds into a one-piece structure, avoiding the blind holes due to errors in welding.

In an embodiment, the connecting tubes are bell-like, wherein the connecting tube extending from an end close to the mold to an end away from the mold gradually increases in diameter. This facilitates the selection and sealed connection of the external pipeline considering that the end of the connecting tube close to the mold is small in size, limited by the total height of the mold. Therefore, the sealed connection of the external high-pressure water pipe or external high pressure gas pipe will be difficult. The connecting tubes are configured to have a bell-like shape, and the connecting tube extending from the end close to the mold to the end away from the mold gradually increases in diameter, reducing the difficulty of sealing and connection of pipeline to make the mold easy to use.

In an embodiment, the stepped holes are formed by electron beam lithography or laser holographic lithography. Therefore, conventional techniques can be adopted to imprint the structures and the processing precision of the stepped holes, particularly, of the lower portion of the stepped holes (nanopores) is guaranteed.

In an embodiment, a cross section of each groove in a direction perpendicular to a direction that the groove extends is in a semicircular shape or a rectangular shape. The groove in a semicircular shape or a rectangle shape is easy to process. In practice, the cross section of the groove may be any shape as long as the size can completely "cover" the lower portion of the stepped hole; namely, the diameter of the groove is larger than that of the lower portion of the stepped hole.

Another object of the present invention is to provide a method for imprinting the mold, which has good imprint quality, simple demolding operation, and small damage to the imprinted structure during the demolding.

The method of imprinting the mold includes the following steps:

Step 1: spin-coating imprint resist onto a surface of a quartz substrate by a spin coater;

Step 2: connecting two connecting tubes at both ends of the groove respectively to an external high-pressure water pump via a first pipeline and an external vacuum pump via a second pipeline;

Step 3: starting a stamping machine; placing the quartz substrate on an upper surface of the mold with a surface of the quartz substrate on which the imprint resist is spin-coated facing down; then placing the quartz substrate and the mold on the stamping machine and fixing with a vacuum air-cushion;

Step 4: heating the imprint resist by the stamping machine to above the glass transition temperature;

Step 5: closing a valve provided at the first pipeline; opening a valve provided at the second pipeline; starting the external vacuum pump to completely pump out the air in the mold; then operating the stamping machine to exert force on the mold to press the imprint resist into the stepped holes until the imprint process is completed;

wherein during the imprint process, the external vacuum pump is opened to continuously vacuumize the interior of the mold to keep a vacuum degree in the interior of the mold at −100 to −300 KPa;

Step 6: stopping heating the imprint resist, and cooling the imprint resist by a cooling device; after the imprint resist is cooled to room temperature, removing the imprint load; turning off the external vacuum pump and closing the valve provided at the second pipeline;

Step 7: opening the valve provided at the first pipeline and then opening the external high-pressure water pump to allow the high-pressure water to enter lower portions of the stepped holes of the upper mold through the grooves, so that a tensile crack occurs at an interface between the imprint resist and walls of the stepped holes and expands until the imprint process and demolding process are completed;

then turning off the external high-pressure water pump and closing the valve provided at the first pipeline;

removing the imprinted structure and turning off the stamping machine.

In the imprint process, the interior of the mold is maintained in a negative pressure, allowing the imprint resist in a elastomeric state to enter the interior of the stepped holes of the upper mold. Therefore, the problem that it is difficult or even impossible for the imprint resist to completely fill the mold with high aspect ratio is effectively solved.

Moreover, during the imprint process, the interior of the cavity of the mold is in a negative pressure state, which minimizes or eliminates the dissolved or adsorbed air in the interior of the imprint resist, so as to reach a desirable compactness of the imprint resist and a good molding quality.

During the demolding, the external high-pressure water (pressure) is used to uniformly apply an upward pressure to the protrusions (the upper portions of the stepped holes) of the imprint resist in a bottom-up manner (that is, an external force is applied to the imprint resist by the upper part of the imprinted structure). The tensile crack occurs at the interface between the imprint resist and a wall of the mold and expands by hydrofracturing, because the tensile strength at the interface between the mold and the imprint resist is lower than the respective tensile strengths of the mold and the imprint resist. When the tensile crack continues to expand to the entire interface, the demolding of the imprinted structure is completed. The present invention basically solves the problem of concentrated vertical stress in the conventional drawing method.

During the demolding, the direction, uniformity and synchronism of stresses are controlled to be the same. The quality of demolding and the stability of the imprinted structure are improved.

Additionally, during the imprinting, some imprint resist enters the lower portions of the stepped holes, forming the excessive protrusions. However, the diameter of the lower portion of the stepped hole is much smaller than the diameter of the upper portion of the stepped hole (1:5 to 1:10). Therefore, even if a small amount of the imprint resist enters the lower portion of the stepped hole to a small distance which leads to a certain error in the imprinted structure, however, there is no need to eliminate the error that is within the allowable range.

In conclusion, compared to the prior art, the present invention has the advantages of simple operation, low imprint load and good molding quality. The mold can not only be used for the molding of conventional imprinted structures, but for the molding of imprinted structures with high aspect ratio.

DETAILED DESCRIPTION OF EMBODIMENTS

The present invention will be described in detail below with reference to the accompanying drawings and the embodiments.

Example 1

Figure 1:
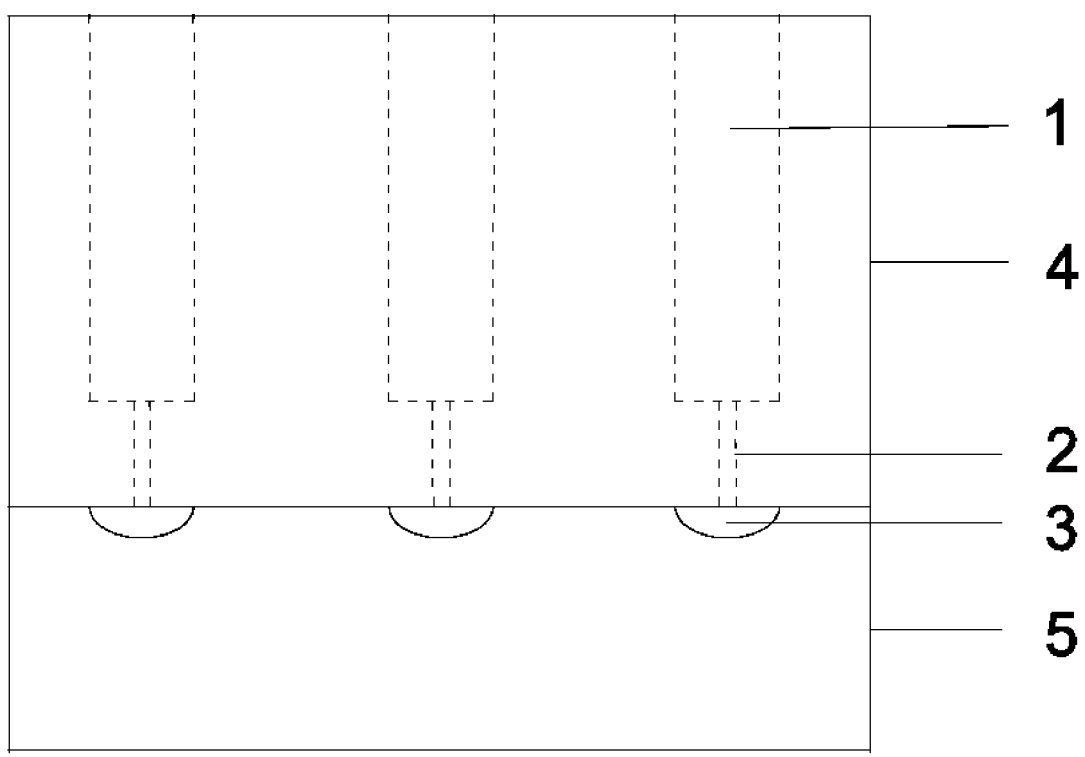
FIG. 1 is a front view of a mold with a cavity for nanoimprint lithography of the present invention.
Figure 2:
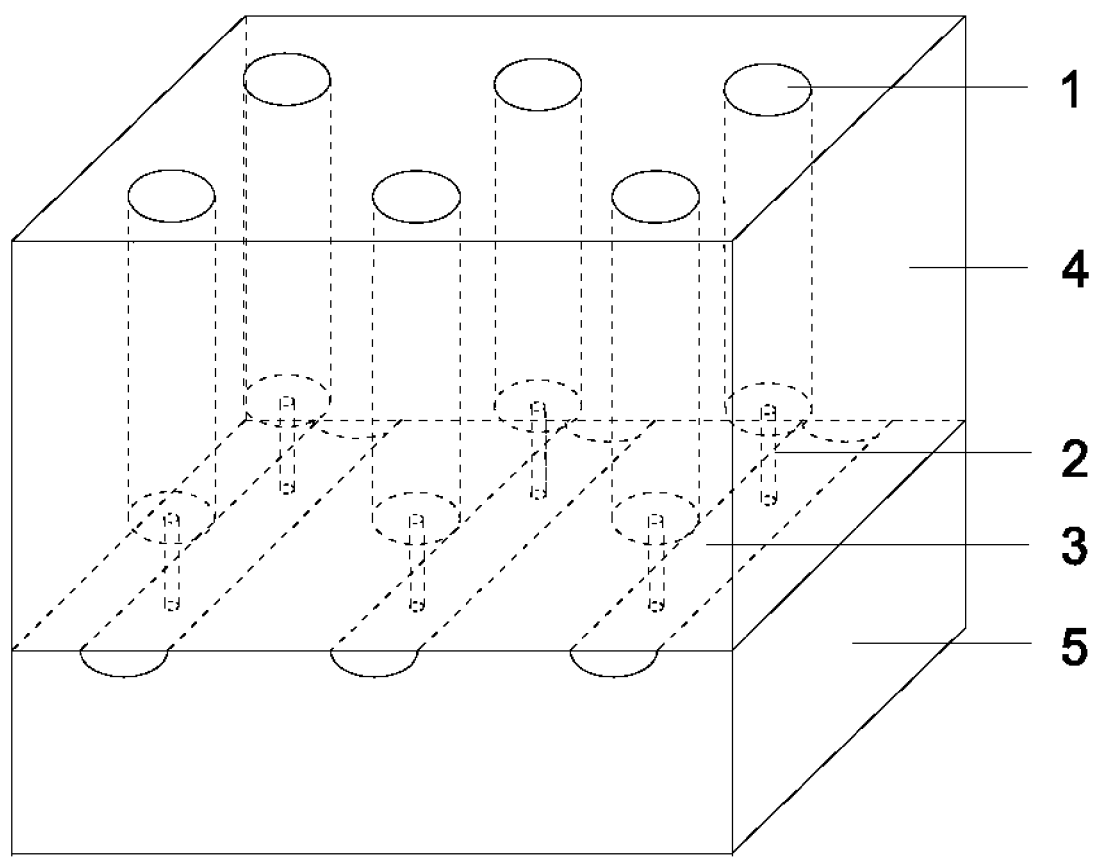
FIG. 2 is a perspective view of the mold with a cavity for nanoimprint lithography of the present invention.
Figure 3:
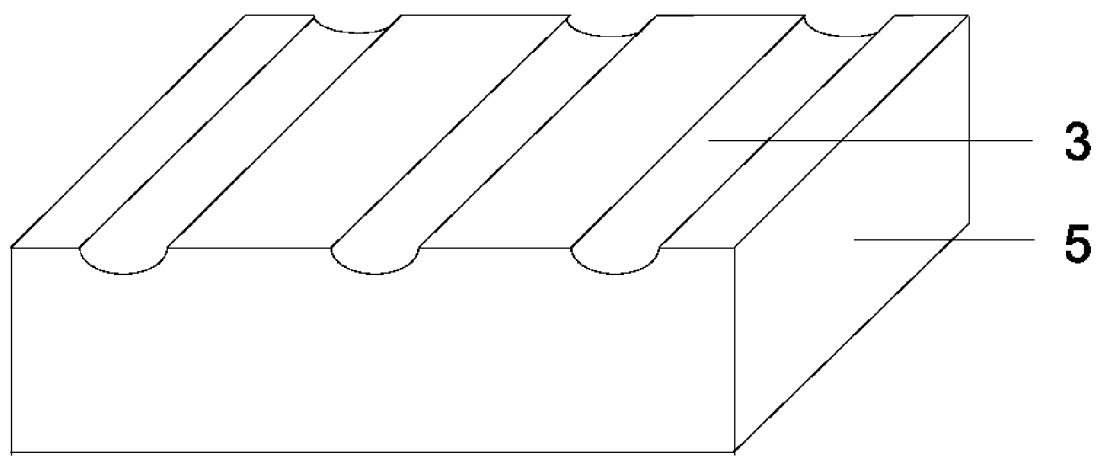
FIG. 3 is an axonometric schematic diagram of a lower mold of the present invention.

As shown in FIGS. 1-3, a mold with a cavity for nanoimprint lithography is a one-piece structure, including an upper mold 4 and a lower mold 5 which are welded together.

The upper mold is evenly provided with a plurality of stepped holes. A diameter of an upper portion of the stepped hole is greater than a diameter of a lower portion of each stepped hole. The stepped holes penetrate through the upper mold. The upper portion 1 of the stepped hole has a diameter of 10 μm and a depth of 100 μm. The lower portion 2 of the stepped hole has a diameter of 100 nm.

The number of the stepped holes and a relative position between the stepped holes respectively correspond to the number of the protrusions of the imprinted structure and a relative position between the protrusions of the imprinted structure. The upper portion of the stepped hole and the corresponding protrusion of the imprinted structure are equal in size.

A plurality of grooves 3 are provided at an upper surface of the lower mold. The grooves penetrate through the lower mold.

The diameter of the groove is greater than 100 nm.

The lower portion of the stepped hole communicates with the corresponding groove.

Two connecting tubes are respectively provided at both ends of the groove. One connecting tube is connected to an external high pressure water pump via a first pipeline, and the other connecting tube is connected to an external vacuum pump via a second pipeline.

The connecting tubes are bell-like. The connecting tube extending from an end close to the mold to an end away from the mold gradually increases in diameter.

The stepped holes are formed by electron beam lithography or laser holographic lithography.

The cross section of the groove in the direction perpendicular to the direction that the groove extends is in a semicircular shape or a rectangular shape.

The method for imprinting the mold comprises the following steps.

Step 1: The imprint resist is spin-coated onto a surface of a quartz substrate by a spin coater.

Step 2: Two connecting tubes at both ends of the groove are respectively connected to an external high-pressure water pump via a first pipeline and an external vacuum pump via a second pipeline.

Step 3: A stamping machine is started. The quartz substrate is placed on an upper surface of the mold with a surface of the quartz substrate on which the imprint resist is spin-coated facing down. Then the quartz substrate and the mold are placed on the stamping machine and fixed with a vacuum air-cushion.

Step 4: The imprint resist is heated by the stamping machine to above the glass transition temperature.

Step 5: A valve provided at the first pipeline is closed and a valve provided at the second pipeline is opened. The external vacuum pump is started to completely pump out the air in the mold. Then the stamping machine is operated to exert force on the mold to press the imprint resist into the stepped holes until the imprint process is completed.

During the imprint process, the external vacuum pump is opened to continuously vacuumize the interior of the mold to keep a vacuum degree in the interior of the mold at −100 to −300 KPa;

Step 6: The heating of the imprint resist is stopped, and the imprint resist is cooled by a cooling device. After the imprint resist is cooled to room temperature, the imprint load is removed. The external vacuum pump is turned off and the valve provided at the second pipeline is closed.

Step 7: The valve provided at the first pipeline is opened and then the external high-pressure water pump is started to allow the high-pressure water to enter lower portions of the stepped holes of the upper mold through the grooves, so that a tensile crack occurs at an interface between the imprint resist and walls of the stepped holes and expands until the imprint process and demolding process are completed.

Then the external high-pressure water pump is turned off and the valve provided at the first pipeline is closed.

The imprinted structure is removed and the stamping machine is turned off.

The principle of demolding according to the embodiment is substantially different from that of the conventional drawing method. The demolding of the mold of the invention is performed by exerting force from the interior of the imprinted structure, but the conventional demolding is performed by exerting force from the exterior of the imprinted structure.

What should be noted is:

1. In this embodiment, the stepped hole is in a round shape, which is merely for illustration.

Actually, the stepped hole may be in any shape, which depends on the shape of the protrusion of the imprinted structure.

2. In this embodiment, the length and diameter of the upper portions of the stepped holes are the same, which is merely for illustration.

Actually, the length and diameter of the upper portions of the stepped holes may be different from one another, depending on the shape of the protrusions of the imprinted structure.

What is claimed is:

1. A mold system with a cavity for nanoimprint lithography, wherein the mold is a one-piece structure, comprising an upper mold and a lower mold which are welded together; the upper mold is evenly provided with a plurality of stepped holes; a diameter of an upper portion of each of the plurality of stepped holes is greater than a diameter of a lower portion of each of the plurality of stepped holes; the stepped holes penetrate through the upper mold;

a length-to-diameter ratio of the upper portion of each stepped hole is 3-30:1; the diameter of the upper portion of each stepped hole is 5-10 times the diameter of the lower portion of each stepped hole;

the number of the stepped holes and a relative position between the plurality of stepped holes respectively correspond to the number of protrusions of an imprinted structure and a relative position between the protrusions of the imprinted structure; the upper portion of the stepped hole and the corresponding protrusion of the imprinted structure are equal in size;

a plurality of grooves are provided at an upper surface of the lower mold; the grooves penetrate through the lower mold;

a diameter of each groove is larger than the diameter of the lower portion of the stepped hole;

the lower portion of the stepped hole communicates with the corresponding groove;

two connecting tubes are respectively provided at both ends of each of the plurality of grooves by welding; one connecting tube is connected to an external high pressure pump via a first pipeline; and the other connecting tube is connected to an external vacuum pump via a second pipeline; and the first pipeline and the second pipeline each are provided with a pressure gage and a pressure regulating valve.

2. The mold of claim 1, wherein the connecting tubes are bell-like, wherein the connecting tube extending from an end close to the mold to an end away from the mold gradually increases in diameter.

3. The mold of claim 1, wherein the plurality of stepped holes are formed by electron beam lithography or laser holographic lithography.

4. The mold of claim 1, wherein a cross section of each groove in a direction perpendicular to a direction that the groove extends is in a semicircular shape or a rectangular shape.

* * * * *